United States Patent [19]
Girard et al.

[11] Patent Number: 6,127,748
[45] Date of Patent: Oct. 3, 2000

[54] INSTALLATION FOR MAKING ELECTRICAL CONNECTION BETWEEN AN EQUIPMENT ASSEMBLY AND A COMMAND AND CONTROL SYSTEM

[75] Inventors: Michel Girard, Corcelles-les-Citeaux; Emmanuel Latour, Talant; Didier Sibille, Dijon, all of France

[73] Assignee: Schneider Electric SA, Boulogne Billancourt, France

[21] Appl. No.: 09/267,772

[22] Filed: Mar. 15, 1999

[30]     Foreign Application Priority Data

Mar. 27, 1998  [FR]  France .................................. 98 03945

[51] Int. Cl.⁷ ...................................................... H01H 3/00
[52] U.S. Cl. ............................ 307/139; 361/788; 361/803
[58] Field of Search .............................. 307/139, 42, 116, 307/150; 361/752, 719, 803, 788, 760

[56]        References Cited

U.S. PATENT DOCUMENTS

| | | | |
|---|---|---|---|
| 4,215,386 | 7/1980 | Prager et al. ............................. | 361/394 |
| 4,334,261 | 6/1982 | Gonzales .................................. | 361/426 |
| 4,401,351 | 8/1983 | Record .................................... | 361/395 |
| 4,738,632 | 4/1988 | Schmidt et al. ......................... | 439/341 |
| 5,493,194 | 2/1996 | Damiano et al. . | |
| 5,541,810 | 7/1996 | Donhauser et al. .................... | 361/686 |
| 5,648,892 | 7/1997 | Wieloch et al. ......................... | 361/788 |
| 5,737,190 | 4/1998 | Marshall et al. ........................ | 361/760 |
| 5,761,052 | 6/1998 | Wheeler-King et al. ............... | 361/803 |
| 5,907,475 | 5/1999 | Babinski et al. ........................ | 361/719 |
| 5,930,112 | 7/1999 | Babinski et al. ........................ | 361/695 |

FOREIGN PATENT DOCUMENTS 0 518 762 A1  12/1992  European Pat. Off. .
36 33 785 A1  4/1988  Germany .

*Primary Examiner*—Jeffrey Gaffin
*Assistant Examiner*—Peter Zura
*Attorney, Agent, or Firm*—Oblon, Spivak, McClelland, Maier & Neustadt, P.C.

[57]          ABSTRACT

An installation for the electrical connection between an assembly of items of electrical equipment which are affixed onto a common baseplate and a system for command and control of that assembly. The installation includes an electrical interface device which provides a connection of signals from the equipment in the assembly with the signal linkage connected to the system. The interface device can be mechanically dissociated from the base plate and is attached to it by a detachable fixing element. The device includes a casing which houses a printed circuit by which two connectors are located which respectively provide the electrical connection with the assembly and with the linkage and which are interconnected through a printed circuit. One of the connectors is specifically adapted to the type of linkage used.

9 Claims, 3 Drawing Sheets

INSTALLATION FOR MAKING ELECTRICAL CONNECTION BETWEEN AN EQUIPMENT ASSEMBLY AND A COMMAND AND CONTROL SYSTEM

BACKGROUND OF THE INVENTION

1. Field of the Invention

This invention relates to an installation for making electrical connection between an assembly of items of electrical equipment which are fixed onto a common baseplate and connected to a printed circuit housed in this baseplate and a command and control system for this equipment assembly, the installation comprising an electrical interface device which provides the connection for the signal from the equipment with a signal linkage connected to said system.

2. Discussion of the Background

It is known to group together items of electrical equipment, such as for example circuit breakers and contactors intended to create a motor starter, on a common base plate in order to simplify the assembly and wiring operations, and in addition, in order to facilitate the connection of said assembly of equipment to a command and control system, such as a process controller. The baseplate houses a printed circuit fitted with connectors and conductive tracks which provide the interconnection of the pieces of equipment one to the other and the external connection of said equipment with the command and control system. Consequently a part of the printed circuit comprises the electrical interface device that provides the external connection. The interface device comprises a usual multi-point connector when the signal linkage with the system is a lead of inputs and outputs from the controller and, when the linkage is an area bus, it comprises a connector suited to the type of bus and a unit fitted with an electronic processing device for the communication of information on the bus.

The electrical interface device differs therefore according to the type of signal linkage chosen. A different printed circuit and consequently a different equipment assembly baseplate is required for each choice of linkage.

SUMMARY OF THE INVENTION

Hence an objective of the invention is an installation for making electrical connection between an equipment assembly and a command and control system that has an electrical interface device, the configuration of which allows one to create a single baseplate for the equipment assembly whatever type of signal linkage is chosen for the system.

The electrical connection installation according to the invention is characterised in that the interface device can be mechanically dissociated from the baseplate and is attached to it by detachable fixing means, the device being made up of a casing that houses a printed circuit on which are located a first conductor and a second conductor which provide respectively the electrical connection with the printed circuit in the baseplate that carries the equipment assembly and with the signal linkage and which are interconnected through the printed circuit, this and the second connector being specifically adapted to the type of signal linkage being used.

According to one characteristic, the interface device comprises at least one selector switch mounted on the printed circuit of the casing and connected, via conductive tracks upstream to the first connector in order to provide the connection with the equipment assembly and downstream to the second connector in order to provide the link with the system, the switch making a selection from a limited number of items of equipment from among those forming the assembly in order to connect them to the system.

BRIEF DESCRIPTION OF THE DRAWINGS

Other characteristics and advantages will become apparent from the description that follows making reference to the appended drawings among which.

DETAILED DESCRIPTION OF THE PREFERRED EMBODIMENTS

Figure 1:
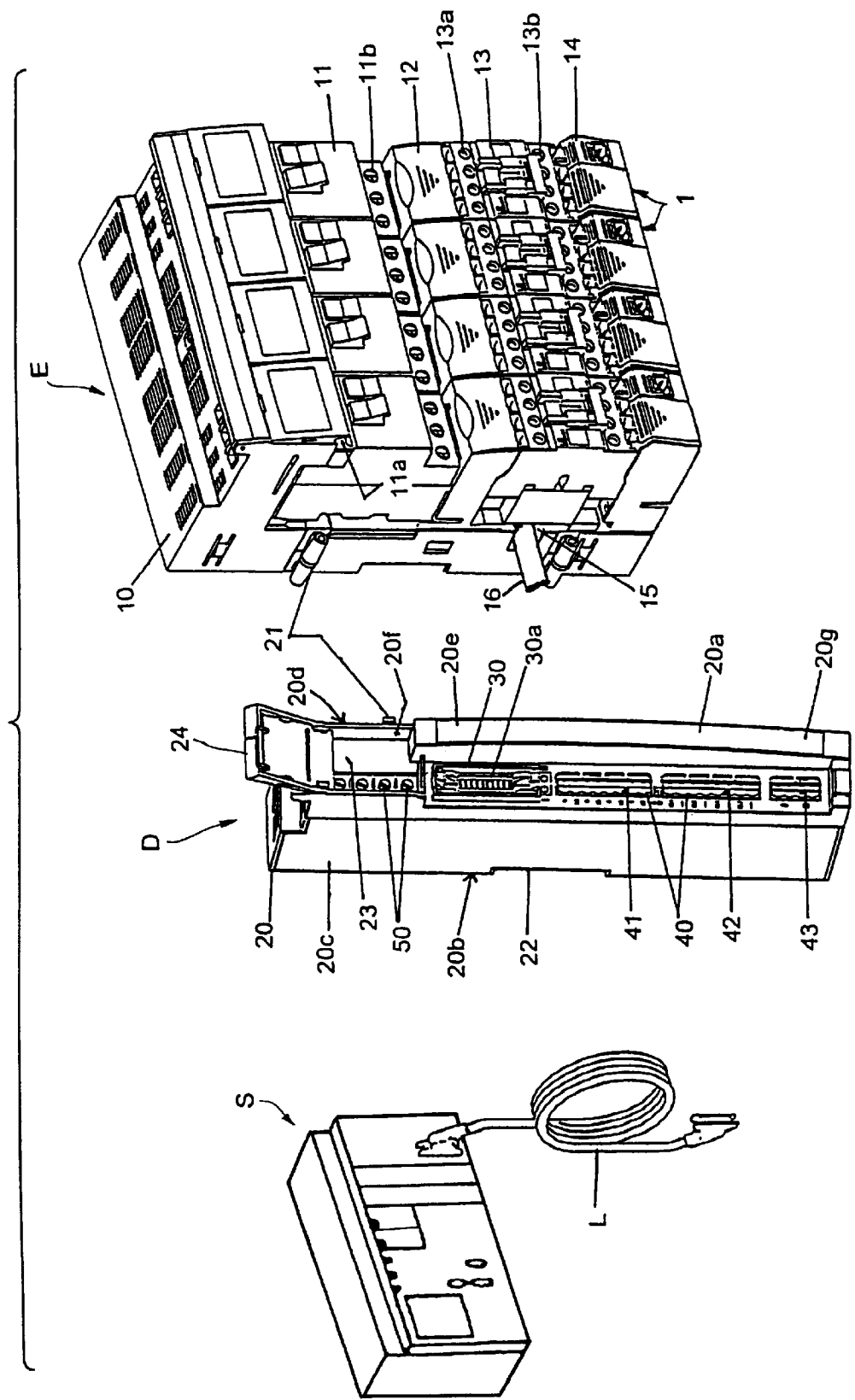
FIG. 1 represents an electrical connection installation according to the invention.

The electrical connection installation that can be seen in FIG. 1 is intended to connect an electrical equipment assembly E such a motor starter assembly to a command and control system S such as a process controller, via an electrical interface device D that can be mechanically dissociated from the assembly E.

The motor starter assembly E comprises start-up elements 1 mounted side by side and fixed onto a common baseplate 10. A start-up element 1 is made up of a circuit breaker 11, an intermediate unit 12, a contactor 13 and a lower unit 14.

The circuit breaker 11 comprises upstream power terminals 11a intended to receive conductive elements connected to power feeder bars, and downstream terminals 11b that must be connected to the power terminals of the contactor. The intermediate unit 12 is used to electrically connect the downstream terminals 11b of the circuit breaker 11 to the upstream power terminals 13a of the contactor 13. The contactor 13 has downstream power terminals 13b intended to be connected to a load such as a motor that is not shown. Finally the lower unit 14 comprises a switch unit that is used to command the contactor coil, such as a mechanical or a static relay.

The electrical pieces of equipment above for each element 1 are connected to a printed circuit that is not visible and is housed in the baseplate 10. This printed circuit provides the interconnections between the items of equipment making up the elements 1 as well as the external connection for command and control of these elements made with electrical interface device D. The baseplate 10 comprises a lateral housing 15 to receive a conductor 16 for making a connection between the assembly E and the interface device D, this conductor being intended to be connected on the one hand to a connector located on the baseplate printed circuit and on the other hand to an analogous connector mounted in the device D.

Figure 2:
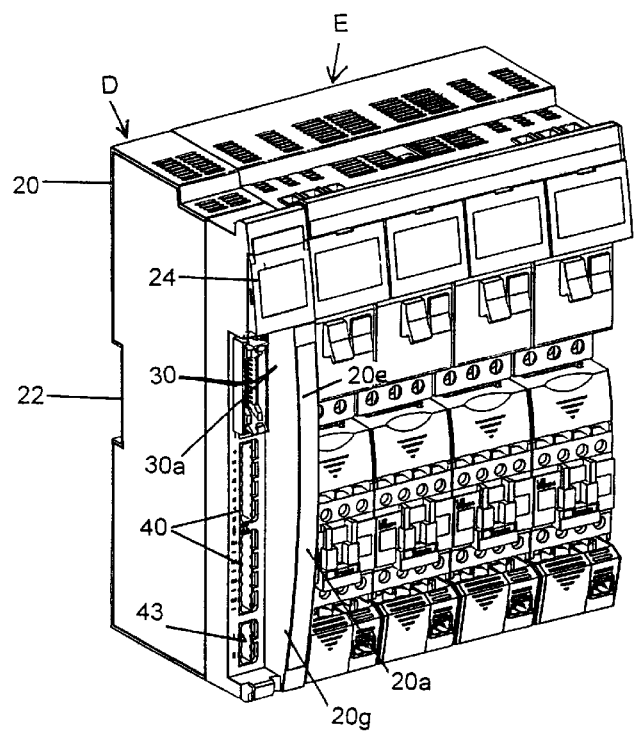
FIG. 2 illustrates an assembly of electrical equipment coupled to the interface device of the invention.

The electrical interface device D consists of a casing 20 of generally parallelepiped shape the height of which is matched to that of the baseplate 10 in such a way as to obtain, after mechanically fixing it to the baseplate, a solid block unit of homogenous shape (FIG. 2).

The casing 20 comprises a front face 20a, a rear face 20b and lateral faces 20c and 20d. Assembly of the casing to the baseplate 10 is carried out lateral to the baseplate, from the side of lateral face 20d, making use of detachable fixing means 21. These means 21 are, for example, constituted by stubs integral with the baseplate 10 and by tenons integral with the casing 20 which are designed to co-operate with said stubs. The rear face 20b includes a central clearance 22 provided to straddle a support rail when this rail is used as a support means for other electrical components.

Figure 3:
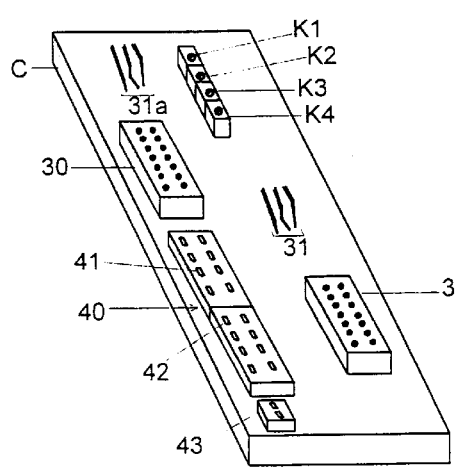
FIG. 3 shows the printed circuit of the interface device.

The casing 20 houses a printed circuit C (FIG. 3) on which is located a first connector 3 for connecting the interface device D to the assembly E, this connector being inside the casing. A lateral opening which is not visible, made in the lateral face 20d of the casing is provided to receive the linkage conductor 16 which has to be connected to connector 3. The printed circuit C also carries a second connector 30 to which a signal linkage L which is connected to the system S is intended to be connected. The connector 30 has a connection portion 30a which is accessible from the outside of the casing on the front face 20a for the connection of linkage L. The printed circuit, through its conductive tracks 31 provides the interconnection between connectors 3 and 30.

When the linkage L is a lead of inputs and outputs for a controller, the connector 30 consists of a type HE10 multi-point connection plug which is inserted into the central part 20e of the front face 20a of the casing (FIGS. 1 and 2). As a variant, the connection plug could be a terminal block if the linkage L consists of wires.

Figure 4:
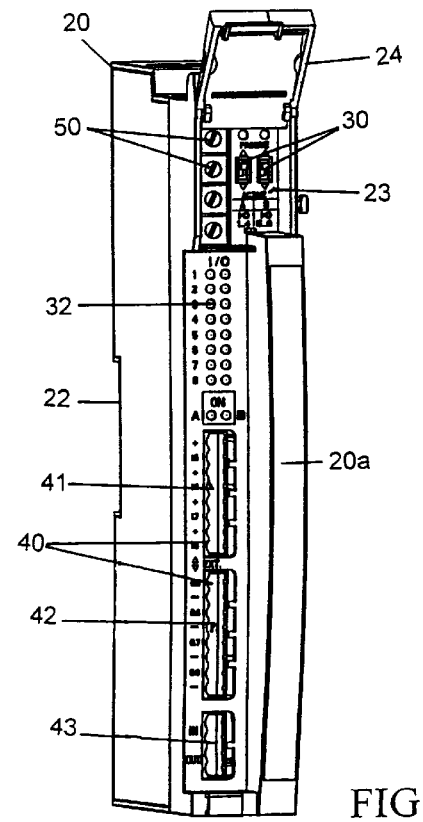
FIG. 4 shows a variant of the interface device.

When the linkage L is an area bus, the connector 30 consists of a connection plug which is suitable for the type and the protocol of the bus, for example a two terminal plug to receive the two respective wires of an AS-I bus (FIG. 4). The connector 30 is installed on the front face, it can, for example, be mounted in a housing 23 situated in the upper part 20f, while in the central part, at the location of the HE10 type connector of FIG. 1 or 2, diodes 32 are inserted which are capable of flashing in such a way as to give information on the state of transmission of input and output data on the bus. The connector 30 and the diodes 32 are mounted on the printed circuit C (not illustrated) in such a way that they are connected to an element fitted to an electronic processing unit also located on the circuit (not illustrated), this element managing the transmission of data between the connectors 3 and 30.

Furthermore, the front face 20a of the casing has, in its lower part 20g, at least one terminal block 40 which is connected on the inside of the casing to the printed circuit C. These terminal blocks are intended to connect the interface device D to the individual items of electrical equipment, not visible in these Figures, via normal wiring. The device D makes the connection of these individual items of equipment with the command and control system S through the connection of the terminal block 40 to the connector 30 via the printed circuit C. The terminal blocks 40 comprise input connection terminals 41 intended for connection with sensor type equipment to receive control data from these pieces of equipment and output connection terminals 42 intended for connection with actuator type equipment in order to supply them with commands.

Finally, the lower part 20g of the front face 20a of the casing includes power supply terminals 43 which may be used for the external power supply to the electrical equipment.

The interface device D of the invention is capable of managing the transmission of input data and output data between the control and command system S and the equipment of baseplate 10 and/or the individual items of equipment.

The input data correspond to information on the open or closed condition of the circuit breakers 11 and the contactors 13 of the start-up elements 1 and on the operating condition of the individual items of electrical equipment constituted by the sensors.

The output data correspond to the commands to open or close the relays of the start-up elements 1 and to actuate the individual items of electrical equipment constituted by the actuators.

The number of inputs and outputs which are connected to the control and command system S via the connector 30 is limited; it is generally sixteen, split up into eight inputs and eight outputs. The number of individual items of electrical equipment in the assembly E which may be connected to the interface device D can be greater than sixteen, and it is therefore preferable for the user to be able to select which of the pieces of equipment are to be connected to the system S. Hence, the interface device D can include selector switches K1–K4 which are mounted on the printed circuit C in such a way that they are connected to the various pieces of electrical equipment and to the connector 30 via conductive tracks 31a. This kind of selector switch is known. A selector switch has, outside its cover, an adjustment means 50, such as a screw head, arranged in such a way that the desired equipment among those items connected to the selector switch can be chosen. The adjustment means 50 is then accessible on the front face 20a of the casing in the housing 23. The housing 23 can be capped by a detachable plate 24.

Figure 5:
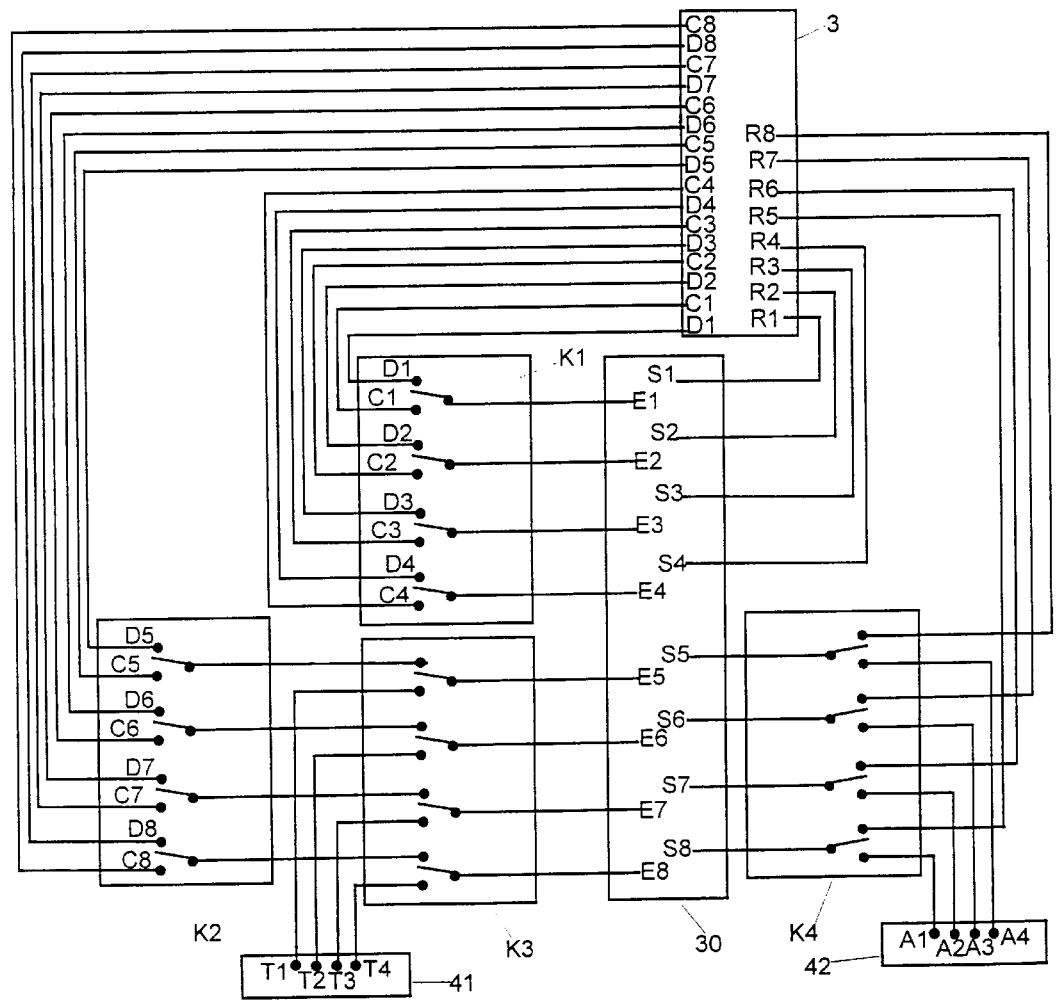
FIG. 5 is an electrical diagram of the connections made to the printed circuit of the interface device.

The choice of the number of selector switches, and the type of switch which is defined by the number of selections, makes it possible, for example, to choose four pieces of equipment out of eight and is made at the time the product is manufactured. In the embodiment described below (electrical diagram in FIG. 5) four separate selector switches K1–K4 have been used, each of which permits four circuit selections to be made.

A first selector switch K1 is connected upstream of connector 3 in a way that connects it to four circuit breakers D1–D4 and four contactors C1–C4 in the assembly E in order to select four pieces of equipment from among these eight. The selector switch K1 is connected downstream from four inputs E1–E4 from connector 30 which correspond to the four pieces of equipment selected. A second selector switch K2 can make a selection of four pieces of equipment from among four other circuit breakers D5–D8 and four other contactors C5–C8 in assembly E. A third selector switch K3 by its connection upstream from selector switch K2 and to connection terminals 41 of terminal block 40 can make the selection between the four pieces of equipment chosen by selector switch K2 and four individual sensors T1–T4 connected to the terminals 41. The selector switch K3 is connected downstream to the connector 30 and makes the selection of four other inputs E5–E8.

Finally, the eight outputs S1–S8 from the connector 30 are split up into four outputs S1–S4 connected to four relays R1–R4 in the assembly E and into four other outputs S5–S8 which correspond to the selection of four items of equipment made by a final selector switch K4 to which are connected four other relays R5–R8 in the assembly E and/or four individual actuators A1–A4 connected to the connection terminals 42 of the terminal block 40.

We claim:

1. An installation for the electrical connection between an assembly of items of electrical equipment which are affixed onto a common baseplate and a system for command and control of that assembly, the installation comprising:

an electrical interface device which provides the connection of signals from the equipment in the assembly to a signal linkage connected to said system, wherein the interface device is mechanically disassociated from the base plate and is attached to the baseplate by detachable fixing means, the interface device including a casing which houses a printed circuit on which a first connector and a second connector are located which respectively provide the electrical connection with the printed circuit of the baseplate and with the linkage and which are interconnected through the printed circuit, the second connector being specifically adapted to the type of linkage used.

2. An electrical connection installation according to claim 1 characterised in that the interface device comprises at least one selector switch mounted on the printed circuit of the casing and connected, through conductive tracks, upstream to the first connector to provide a connection with the assembly and, downstream, to the second connector to provide the linkage with the system, the selector switch making the selection of a limited number of items of equipment from among those in the assembly in order to connect them to the system.

3. An electrical connection installation according to claim 1 or 2 characterised in that the interface device comprises, accessible on a face of the casing and located on the printed circuit, a terminal block for connection to individual items of electrical equipment in order to connect them electrically to the control and command system.

4. An electrical connection installation according to claim 3 characterised in that the interface device comprises several selector switches, at least one first selector switch connected to the first connector for linkage of the equipment in the assembly making a selection from among said items of equipment, another selector, connected upstream of the first selector and the terminal block, that makes a selection between the pieces of equipment chosen by the first selector and individual items of equipment connected to the terminal block.

5. An electrical connection installation according to claim 1 characterised in that the casing of the device comprises on one of its faces at least one adjustment means which is linked to a first selector switch inside the casing, in a manner that establishes a given selection of items of electrical equipment from among those connected to said selector switch.

6. An electrical connection installation according to claim 1 or 2 characterised in that the second connector to which the linkage is connected, is accessible from the outside of the casing on one of its faces.

7. An electrical connection installation according to claim 1, for which the signal linkage is an area bus, characterised in that the second connector is a connection plug adapted to the bus and the printed circuit includes an element fitted with an electronic processing unit that manages the exchange of signals between the bus and the first connector.

8. An electrical connection installation according to claim 7, characterised in that the casing of the interface device comprises on one of its faces and, located on the printed circuit, a series of diodes which are capable of flashing during the transmission of signals on the bus.

9. An electrical connection installation according to claim 1, for which the signal linkage is a controller lead, characterised in that the second connector is a multi-point connection plug.

* * * * *